(12) United States Patent
Piemonte

(10) Patent No.: US 10,971,643 B2
(45) Date of Patent: Apr. 6, 2021

(54) IMPLEMENTATION OF AN OPTIMIZED AVALANCHE PHOTODIODE (APD)/SINGLE PHOTON AVALANCHE DIODE (SPAD) STRUCTURE

(71) Applicant: Avago Technologies International Sales Pte. Limited, Singapore (SG)

(72) Inventor: Claudio Piemonte, Regensburg (DE)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 16/169,445

(22) Filed: Oct. 24, 2018

(65) Prior Publication Data
US 2020/0135956 A1 Apr. 30, 2020

(51) Int. Cl.
| | | |
|---|---|---|
| H01L 31/107 | (2006.01) | |
| H01L 31/02 | (2006.01) | |
| H01L 27/146 | (2006.01) | |
| H01L 27/144 | (2006.01) | |
| H01L 31/18 | (2006.01) | |
| H01L 31/036 | (2006.01) | |
| H01L 25/16 | (2006.01) | |
| H01L 31/0232 | (2014.01) | |
| H01L 31/0236 | (2006.01) | |

(52) U.S. Cl.
CPC .......... *H01L 31/107* (2013.01); *H01L 25/167* (2013.01); *H01L 27/1443* (2013.01); *H01L 27/14643* (2013.01); *H01L 27/14689* (2013.01); *H01L 31/02327* (2013.01); *H01L 31/02363* (2013.01); *H01L 31/1804* (2013.01)

(58) Field of Classification Search
CPC .................................................... H01L 31/107
See application file for complete search history.

(56) References Cited

U.S. PATENT DOCUMENTS

| | | |
|---|---|---|
| 8,574,945 B2 | 11/2013 | Sanfilippo et al. |
| 9,178,100 B2 | 11/2015 | Webster et al. |
| (Continued) | | |

OTHER PUBLICATIONS

Ceccarelli "Red-Enhanced Photon Detection Module Featuring a 32 × 1 Single-Photon Avalanche Diode Array," IEEE Photonics Technology Letters, Mar. 2018, vol. 30, No. 6, pp. 557-560 (Abstract only).

(Continued)

*Primary Examiner* — Omar F Mojaddedi
(74) *Attorney, Agent, or Firm* — Morgan, Lewis & Bockius LLP

(57) ABSTRACT

A semiconductor device, sensor, and array of SPAD cubes are described. One example of the disclosed semiconductor device includes an array of single-photon avalanche diodes, each single-photon avalanche diode including an undepleted anode region, an undepleted cathode region, an active depleted region positioned between the anode region and cathode region, and at least one conductive trench extending between the anode region and cathode region. In some examples, the at least one conductive trench surrounds the active depleted region and reflects light back into the active depleted region such that one or more photons can be absorbed within the active depleted region even though an absorption coefficient of the light is greater than a thickness of the active depleted region.

12 Claims, 3 Drawing Sheets

(56) References Cited

U.S. PATENT DOCUMENTS

| | | | |
|---|---|---|---|
| 9,773,930 B2 | 9/2017 | Motta et al. | |
| 2008/0308738 A1* | 12/2008 | Li | H01L 31/107 250/370.11 |
| 2009/0184317 A1* | 7/2009 | Sanfilippo | H01L 31/107 257/49 |
| 2010/0148040 A1* | 6/2010 | Sanfilippo | H01L 31/1075 250/214.1 |
| 2015/0200222 A1* | 7/2015 | Webster | H01L 31/107 250/208.1 |
| 2016/0079464 A1* | 3/2016 | Sasaki | H01L 31/103 257/432 |

OTHER PUBLICATIONS

Durini et al. "BackSPAD-BACK-Side Illuminated Single-Photon Avalanche Diodes: Concept and Preliminary Performances," IEEE NSS-MIC, Jan. 2012, 3 pages.

Mathewson et al. "Photon-counting arrays for spatially varying low-light-level signals," Proc. SPIE 2022, Photodetectors and Power Meters, Oct. 1993, (Abstract only).

\* cited by examiner

IMPLEMENTATION OF AN OPTIMIZED AVALANCHE PHOTODIODE (APD)/SINGLE PHOTON AVALANCHE DIODE (SPAD) STRUCTURE

FIELD OF THE DISCLOSURE

The present disclosure is generally directed toward a semiconductor device and particularly directed toward Silicon Photomultipliers (SiPM) and/or Single-Photon Avalanche Diode (SPAD) structures.

BACKGROUND

Single-photon avalanche diodes (SPADs) and Silicon Photomultipliers (SiPMs) are light silicon sensors able to detect single photons. They are often configured to work in Geiger mode (e.g., biased above the breakdown voltage) so that each photon impacting the device creates a controlled avalanche. These devices are usually produced using conventional CMOS technologies. Current main applications for SPADs and SiPMs are in the fields of radiation detection, particularly for medial, safety, and security fields. Another emerging field for the use of these devices is in the field of Lidar, especially for long-distance object detection in autonomous automotive applications.

Single-photon avalanche photodiodes (SPADs) are becoming of wide use in many domains, such as nuclear medicine, radiation detection in safety and security, biology, and Lidar. SPADs can be produced in custom micro-fabrication technology as well as in standard CMOS. The first approach allows a technology development aimed at optimizing the sensor performance in terms of efficiency and noise. The second approach allows the integration of intelligence directly on a photo-sensor.

BRIEF DESCRIPTION OF THE DRAWINGS

The present disclosure is described in conjunction with the appended figures, which are not necessarily drawn to scale.

DETAILED DESCRIPTION

Figure 1A:
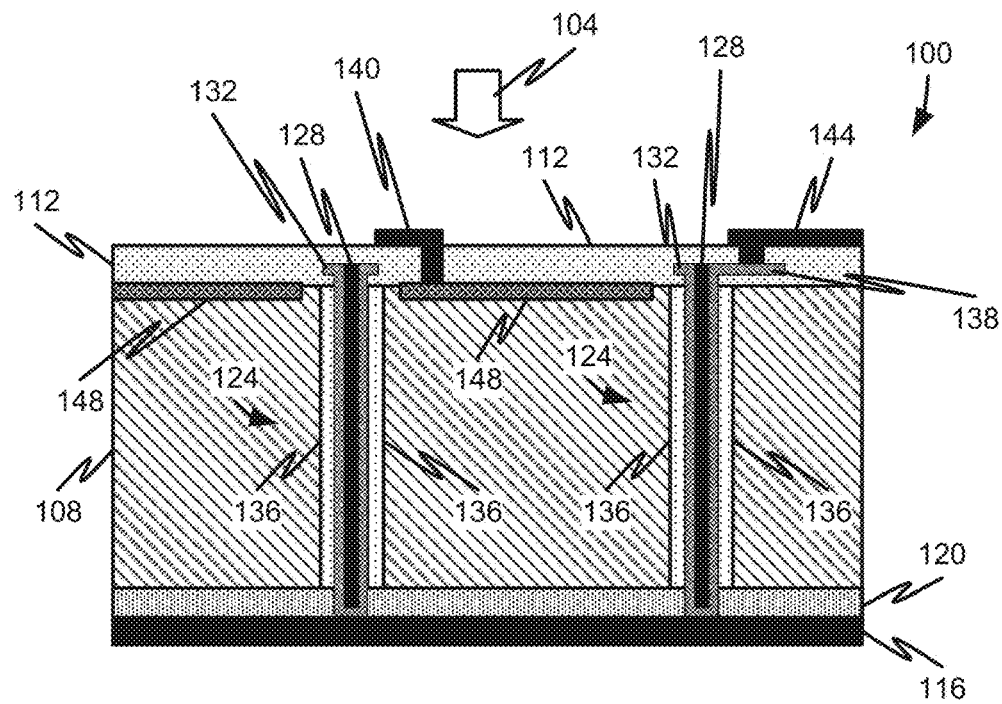
FIG. 1A is a cross-sectional view of a semiconductor device having a first configuration according to at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Figure 1B:
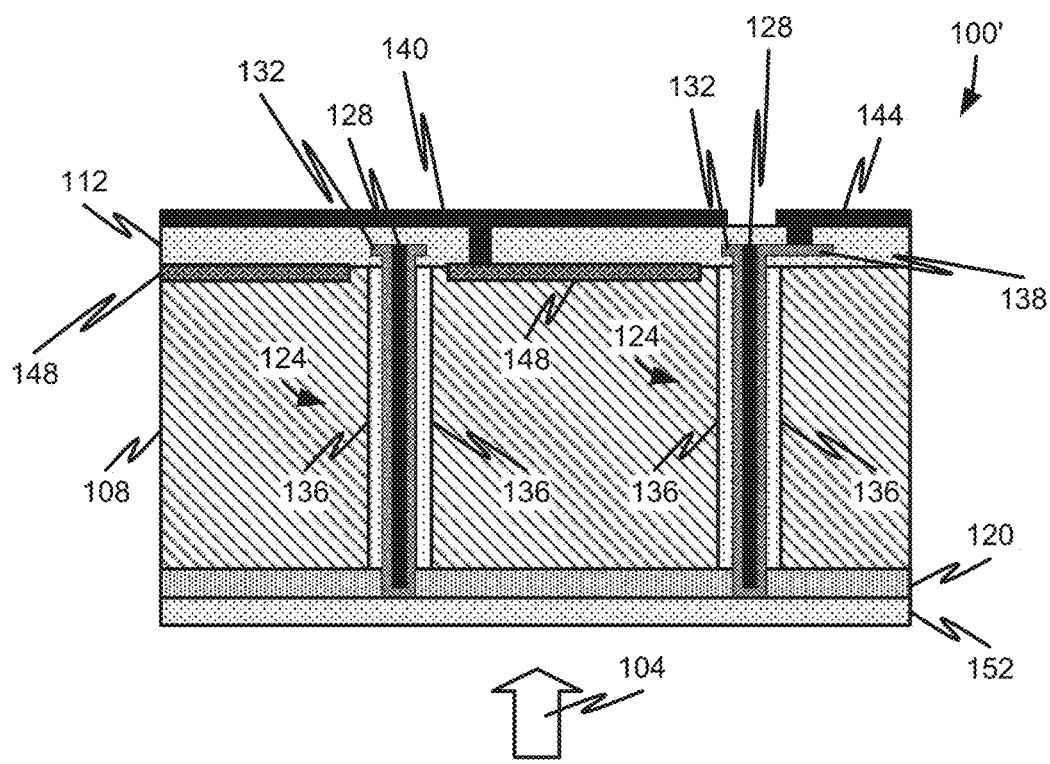
FIG. 1B is a cross-sectional view of a semiconductor device having a second configuration according to at least some embodiments of the present disclosure.
Figure 2:
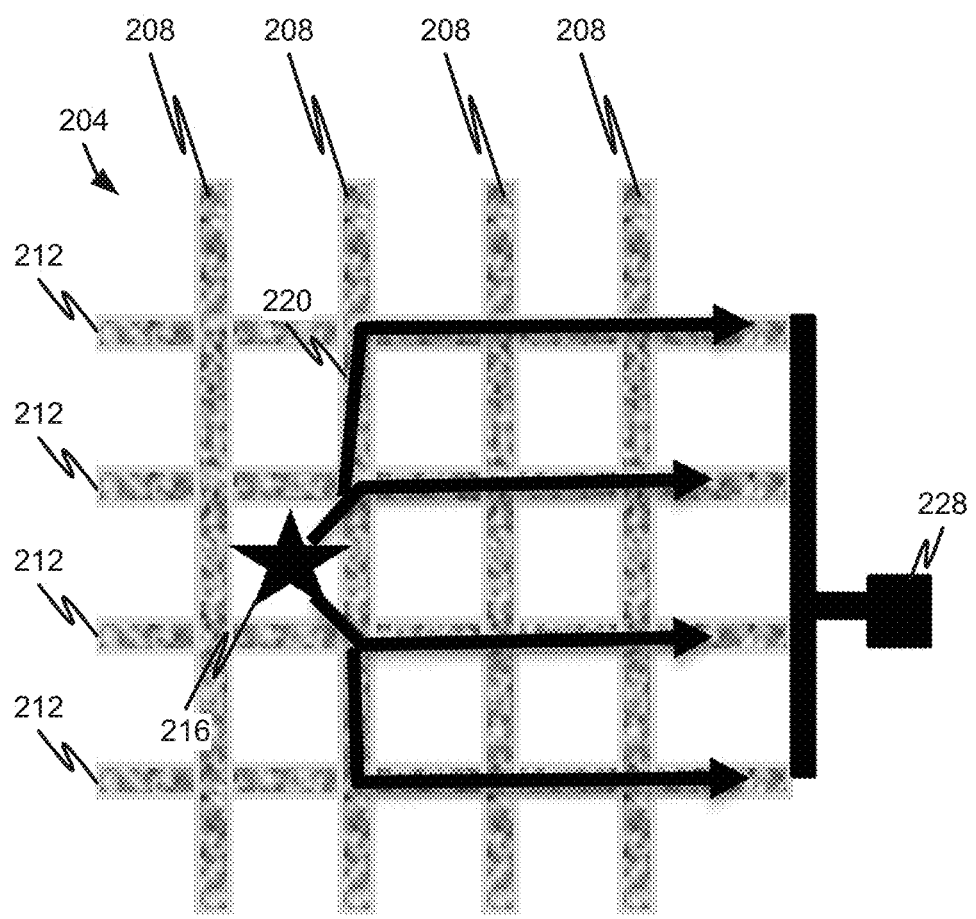
FIG. 2 is a plan view of a SiPM according to at least some embodiments of the present disclosure.
Figure 3:
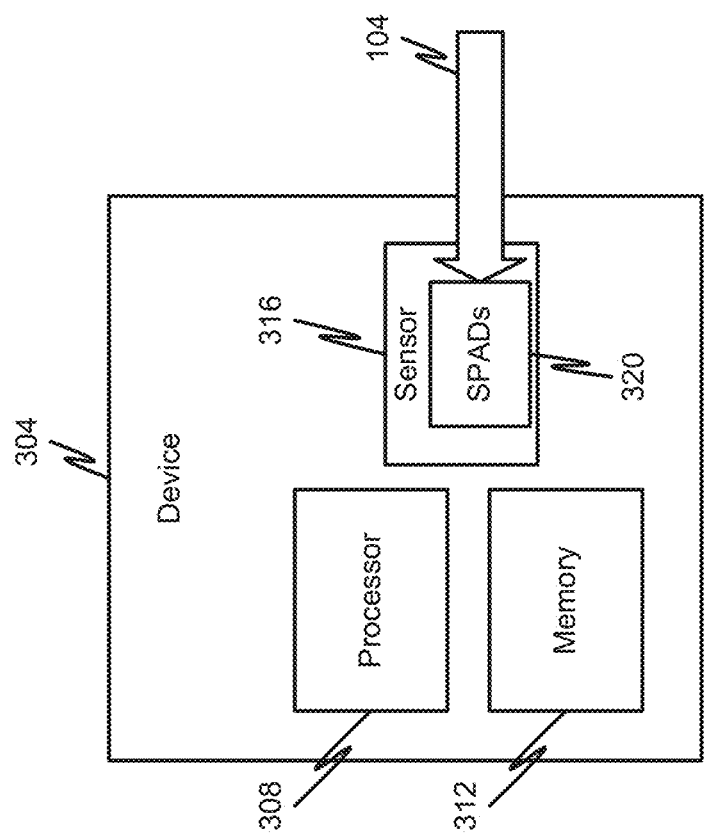
FIG. 3 is a block diagram of a computational device according to at least some embodiments of the present disclosure.

Referring now to FIGS. 1-3, various configurations of semiconductor devices, silicon photomultipliers, silicon photomultiplier circuits, light sensors, and the like are depicted and described. Although some of the devices depicted in the figures correspond to intermediate devices or portions of devices, one of ordinary skill in the art will appreciate that any of the devices or systems can be considered a semiconductor device, a sensor, or silicon photomultiplier/SPAD without departing from the scope of the present disclosure.

APDs and Single-photon avalanche photodiodes (SPADs) are becoming of wide use in many domains requiring the detection of weak light and/or very fast responses. One typical and important example is distance measurements by direct or indirect time-of-fight. In this application, near-infrared (NIR) light is usually used, for example, having a wavelength of 905 nm. This particular wavelength of NIR light is commonly used in automotive long-range distance Lidar. The most important requirements from the sensor point of view are: high detection efficiency, high immunity against background light, and absence of slow components in the response signal due to correlated noise or diffusion processes. Since the absorption length of NIR light in silicon is rather long, mirrors are usually placed on the sensor surface to extend the path of the photon inside the active area. Two types of sensors have been developed to facilitate light detection: (1) a front-side illuminated (FSI) sensor which features a buried dielectric mirror whereas and (2) a back-side illuminated (BSI) sensor exhibiting a dielectric/metal reflector on the top surface and trenches that electrically separate one SPAD from another. Both approaches help in minimizing the slow signal components due to carrier diffusion because the thickness of the non-depleted parts in contact to the active layer are minimized.

The problem remains, however, to provide the bias voltage to the highly-doped layer opposite the processed side (e.g., an independent p+ layer or any other type of highly-doped layer) of each APD or SPAD arranged in an array with the aforementioned characteristics. Electrical access to the highly-doped layer should have the following features: low resistance, small size to minimize fill factor loss, and low process complexity.

It is with respect to the above-noted challenges, that embodiments of the present disclosure were contemplated. In some embodiments, the use of a conductive trench is proposed without any isolation barrier between the electrically conductive filling and the silicon. A suitable implementation exhibits a trench that is etched down to the p+ layer. In some embodiments, a first layer of doped polysilicon is deposited in the trench. The doping type may be the same as the one of the active layer (e.g., a p-type). During polysilicon deposition and subsequent annealing, the dopant slightly diffuses into the silicon electrically screening the defects onto the trench walls. In some embodiments, the polysilicon layer provides: (i) a smooth wall surface inside the trench for following deposition steps; (ii) a barrier for possible etching steps from the bottom side; and (iii) contact access on the front side. The trench may subsequently be filled up with a second different material. One non-limiting example of such a filler material includes a metal layer (e.g., Tungsten). In some embodiments, this layer is completely removed from the top surface. In some embodiments, the polysilicon may be completely removed except from one or more contact regions which will be accessible from the contact metal layer (e.g., a p+ contact).

In some embodiments, the conductive trenches around each SPAD/APD allow the creation a very low resistivity path to the front side without any additional structure inside the SPAD/APD. Indeed, the trench(es) provides both a vertical connection, from bottom to top, and a grid-like horizontal connection to the external contact pad and may be useful for both front-side illumination and back-side illumination.

In some embodiments, an anti-reflective coating (ARC) may be placed on the light entrance side whereas the reflector is placed on the opposite surface. The conductive trenches along with the reflector on top or bottom surface create a light trapping box which can considerably enhance the photon detection efficiency by multiple reflections in the active area.

In some embodiments, the trench may be filled with a polysilicon layer plus a metal layer. As an alternative, the trench may be completely filled by a single doped polysilicon layer, or by a two-layer structure of doped polysilicon plus silicon oxide. Alternatively or additionally, the trench may be filled with any type of opaque material helping in the reduction of optical cross-talk between adjacent active volumes of SPADs. Another further alternative is to fill the trench completely with a metal layer.

According to embodiments of the present disclosure, a semiconductor device, such as an SiPM or the like, may include a structure having an array of APD/SPADs with thin (e.g., a maximum of a few microns) un-depleted anode and cathode regions which are separated by vertical trenches. In some embodiments, each trench surrounding each APD/SPAD may be conductive and may be reflective or absorbing. Each active area of each APD/SPAD may also be provided with an optical reflector on the side opposing the light-entrance side of the active volume.

It should be appreciated that embodiments of the present disclosure can be applied to arrays of SPADs/SiPMs, as well as any other type of APD arrays. Embodiments of the present disclosure can be used in front-side as well as back-side illuminated devices. In a back-side illuminated device, 3D integration with an electronics layer may be implemented. Embodiments disclosed herein may be well-suited for SPADs/SiPMs designed for the detection of NIR light. In such an implementation, thick active layers may be provided and reflection can exploited to improve the absorption probability within the active volume of each APD/SPAD. More particular fields of application for such a sensor relate to an SPAD and SiPM operating at or near NIR wavelengths used in connection with time-of-fight Lidar systems.

With reference now to FIGS. 1A and 1B, an illustrative semiconductor device 100, 100' will be described in accordance with at least some embodiments of the present disclosure. A first configuration of the semiconductor device 100 will be described in accordance with at least some embodiments of the present disclosure. The first configuration of the semiconductor device 100 may correspond to a FSI type of semiconductor device 100 where light 104 impacts the semiconductor device 100 at the top or front side thereof.

The semiconductor device 100, in some embodiments, may correspond to a SiPM or similar type of device having a plurality of APDs/SPADs. The semiconductor device 100 may include a plurality of active volumes representing the plurality of APDs/SPADs. FIG. 1A shows details of one such active volume that is adjacent to an edge of the array of APDs/SPADs. That is, the depicted right side of the semiconductor device 100 may correspond to an outermost edge of the array of APDs/SPADs. The middle active area positioned between the two trenches 124 may be reproduced throughout a larger area that is not depicted.

The illustrative cross-section of the semiconductor device 100 exhibits a plurality of APDs/SPADs that may be electrically connected in parallel with one another and each of the plurality of APDs/SPADs may include an active depleted layer 108 (e.g., an active volume) whose side boundaries are defined by one or more conductive trenches 124. The active depleted layer 108 (and the active volume defined therein) may also be defined at its lower boundary by a first undepleted region 120 and at its upper boundary by a second undepleted region 148. Thus, the material of the active depleted layer 108 (and the active volume defined therein) may be situated between one or more adjacent trenches 124, the first undepleted region 120, and the second undepleted region 148.

In some embodiments, the first undepleted region 120 may correspond to a doped semiconductor material having a first type of doping (e.g., a p+ doping) whereas the second undepleted region 148 may correspond to a doped semiconductor material having a second type of doping that is opposite the first type of doping (e.g., a n+ doping). It should be appreciated that, in some embodiments, the first undepleted region 120 may have a n+ doping in which case the second undepleted region 148 may have a p+ doping. In some embodiments, the first undepleted region 120 corresponds to one of an undepleted anode region and undepleted cathode region for the active volume. The second undepleted region 148 may correspond to the other of the undepleted anode region and undepleted cathode region for the active volume. Thus, if the first undepleted region 120 corresponds to an undepleted anode region, then the second undepleted region 148 may correspond to an undepleted cathode region. The layers 120 and 148 may also have a more complex doping structures and junctions. For simplicity of conversation, either region 120 or 148 may be referred to as an undepleted region.

In the depicted embodiment, light 104 will initially travel through the second undepleted region 148 and may not (but still could) be detected within the second undepleted region 148 during this initial pass-through. As will be discussed herein, the second undepleted region 148 may operate as a receiver of current (e.g., electrons) in response to one or more photons being absorbed within the active volume of the depleted layer 108. The absorption of a photon from light 104 within the active volume of the depleted layer 108 may occur as the light 104 initially passes through the active volume or as the light 104 reflects within the active volume. In some embodiments, the first undepleted region 120 may have a reflective layer (or reflector) 116 provided on the side of the first undepleted region 120 that opposes the active volume. Light 104 may be configured to reflect off the reflector 116 and back into the active volume. Similarly, the conductive trenches 124 may be configured to reflect light 104 back into the active volume of the depleted layer 108. In some embodiments, the combination of the trenches 124 and reflector 116 help to improve the absorption within the active volume, even if the thickness of the depleted layer 108 is less than the absorption coefficient of light 104 at the wavelength of the light 104. For instance, the reflection of light by the trenches 124 and reflector 116 helps to effectively extend the amount of material 108 that light passes through. Said another way, the trenches 124 and reflector 116 help to extend the path light 104 travels through the active volume, thereby increasing the likelihood of photon absorption within the active volume. In some embodiments, the reflector 116 includes a reflective or opaque dielectric material. In some embodiments, the reflector 116 comprises a reflective or opaque metal. In some embodiments, the reflector 116 exhibits mirror-like properties and reflects substantially all of the light 104 that reaches the reflector 116.

In some embodiments, the linear distance between the first undepleted region 120 and the second undepleted region 148 may be on the order of 20 microns or less, possibly 10 microns or less, and, in some embodiments no more than 5 microns. The active volume defined between the undepleted regions 120, 148, however, may be configured to detect NIR light, which exhibits a wavelength of approximately 800 to 1000 nm and an absorption coefficient larger than 10 micron. Thus, the active volume may have a thickness that is at least half the absorption coefficient at the wavelength of light 104.

In the depicted embodiment, the first undepleted region 120 has a first face in contact with the material of the active depleted layer 108 and a second opposing face in contact with the reflector 116. At the opposite side of the semiconductor device 100, the second undepleted regions 148 of each active volume are provided between the active depleted layer 108 and a dielectric layer 112. In some embodiments, the dielectric layer 112 may include or be provided with an anti-reflective material to help ensure that light 104 passes into the active volume rather than being reflected at the light-receiving surface of the semiconductor device 100.

In some embodiments, each of the second undepleted regions 148 may be in electrical communication with a first type of metal contact 140. This electrical communication may be achieved with a conductive material passing through the dielectric layer 112. The edge of the array, on the other hand, may not include a second undepleted region 148, but rather may have a second metal contact positioned above the dielectric layer 112 overlapping the active depleted layer 108 positioned outside the outermost trench 124. The second metal contact may correspond to a p-type contact whereas the first type of metal contact 140 may correspond to an n-type contact. It should be appreciated, however, that the types of contacts provided by the first and second contacts 140, 144 may be reversed such that the first metal contact 140 corresponds to a p-type contact and the second metal contact 144 corresponds to an n-type contact. In some embodiments, the type of contact used above the active volume of an APD/SPAD may depend upon the doping of the second undepleted region 148 (e.g., so as to match the doping of the second undepleted region 148 with the first type of metal contact 140). In some embodiments, the first and second metal contacts 140, 144 may correspond to or include a conductive material, such as metal or a conductive ink.

In some embodiments, the trenches 124 may be distributed throughout the semiconductor device 100 in a grid or array configuration. The construction of the trenches 124 will now be described in accordance with some embodiments, but should not be construed as limiting the present disclosure. In the illustrative example, the trench 124 surrounding each active volume includes a conductive material 128 deposited within a polysilicon material 132. The polysilicon material 132 may first be deposited within a trench or void created within the active depleted layer 108. In some embodiments, the polysilicon material 132 includes any type of material and may be configured to completely surround the conductive material 128 of the trench 124. Each trench 124 may further be provided with an outer trench doping 136 that is provided adjacent to and at the perimeter of the polysilicon material 132. In some embodiments, the outer trench doping 136 may be similar to the type of doping provided in the first undepleted region 120. In other embodiments, the outer trench doping 136 may be similar to the type of doping provided in the second undepleted region 148. The thickness of the outer trench doping 136 may be on the order of a few hundred nanometers and, in some embodiments, may exhibit a gradient. Specifically, the doping concentration may be greater nearer the polysilicon material 132 and decrease gradually further away from the polysilicon material 132.

In some embodiments, the trenches 124 may extend completely between the first undepleted region 120 and the second undepleted region 148 and may completely surround each active volume in the semiconductor device 100. In some embodiments, the polysilicon material 132 of each trench 124 may extend completely through the first undepleted region 120 and may contact the reflector 116. The polysilicon material 132 may separate the conductive material 128 from the reflector 116 and from the active depleted layer 108. Thus, the conductive material 128 may create a low-conductive channel and also reflect light. Specifically, the conductive material 128 may be substantially reflective and/or opaque to the light 104, which enables the trench 124 to reflect the light 104 back into the active volume that received the light 104.

As shown in FIG. 1A, at least one of the trenches 124 (e.g., an outermost of the trenches 124) may include a trench arm 138 that extends and provides a connection between the polysilicon material 132 and the second metal contact 144. This particular trench arm 138 may only be provided at the outermost trench(es) 124 and may not be provided as part of the trenches 124 in the inner part of the trench grid. In the depicted embodiment, the trench arm 138 is constructed of the polysilicon material 132, but it should be appreciated that the conductive material 128 may alternatively or additionally be used to construct the trench arm 138. As shown in FIG. 1A, the trench arm 138 may differ from the other lips of the polysilicon material 132 provided in other trenches 124 in that the trench arm 138 extends beyond the outer trench doping 136 and the lips of the polysilicon material 132 provided in other trenches 124 do not extend beyond the outer trench doping 136. In both trenches 124, the trench arm 138 and lips of the polysilicon material 132 are positioned within the dielectric layer 112 and above the second undepleted region 148. Alternatively, one can avoid the arm to provide a bias to the layer 120. To this purpose, at the right edge of the APD/SPAD array, a p+ layer can be created on the top surface of the silicon in direct contact to the doped layer 136. The metal 144 can now contact this new p+ layer instead of the arm. It should also be appreciated that the lips of the polysilicon material 132 are optional and do not necessarily have to be used in all configurations.

With reference now to FIG. 1B, an alternative configuration of a semiconductor device 100' will be described in accordance with at least some embodiments of the present disclosure. The semiconductor device 100' may be similar or identical to the semiconductor device 100 except that the second configuration of the semiconductor device 100' accept back-side illumination rather than front-side illumination. Specifically, the light 104 impacts the bottom or back-side of the semiconductor device 100', which may require a repositioning of certain elements of the semiconductor device 100' relative to the first configuration thereof.

In the depicted embodiment, the second configuration of the semiconductor device 100' still includes an active depleted layer 108 positioned between a first undepleted region 120 and a second undepleted region 148. The doping of the undepleted regions 120, 148 may be similar or identical to the doping of the semiconductor device 100. The trenches 124 and the construction thereof in the semiconductor device 100' may be similar or identical to the trenches 124 in the semiconductor device 100.

One difference in the second configuration of the semiconductor device 100' is that the first undepleted region 120 is positioned between the active depleted layer 108 and an anti-reflective material 152. This enables the light 104 to pass into the active volume of the depleted layer 108 without reflecting off the back-side of the device 100'.

Another difference lies in the construction of the first type of metal contact 140. Specifically, the first type of metal contact 140 may be extended so as to completely cover the backside/top of the active volume. In this way, the first type of metal contact 140 now operates as a reflector for light 104 that enters the active volume of the depleted layer 108. The material used for the first type of metal contact 140 may be similar or identical to the material used in the first type of metal contact 140 for the semiconductor device 100. However, the surface area covered by the material used for the first type of metal contact 140 may be significantly larger in the second configuration of the semiconductor device 100' so as to promote light reflection within the active volume. In this particular configuration, a separate reflector 116 is not used, but rather the first type of metal contact 140 becomes multi-functional in that it conducts current within the semiconductor device 100' and also reflects light 104 back into the active volumes of the semiconductor device 100'. In this description, the SPADs are all connected together through the layer 140. In a more general case, the metal layer 140 can be also patterned. For example, one can open a narrow gap in the layer 140 around each APD/SPAD. This allows an independent electrical access contact for each SPAD which is of interest when independent information from each SPAD is needed. Having a small separation gap would not prevent the reflection mechanism mentioned above for the continuous metal.

The construction of the second type of metal contact 144 in semiconductor device 100' may be similar or identical to the construction of the second type of metal contact 144 in semiconductor device 100.

In either configuration, the active depleted layer 108 may be formed from any known type of semiconductor material (e.g., GaAs, GAP, or any other Group IV or Group V semiconductor). To the extent doping of the active depleted layer 108 (e.g., at the outer trench toping 136) of doping of the undepleted regions 120, 148 is desired, any suitable type of known doping process or sequence of steps can be used to achieve such a doping.

The second undepleted region 148 may correspond to any material or combination of materials, in a layered or unlayered format, that enables the production of a multitude of carriers in response to receiving one or more photons at the photosensitive area (e.g., the first portion 108). Suitable examples of materials that can be used for the the second undepleted regions 148 may include, without limitation, Si, Ge, InGaAs, PbS, MCT, or the like. In some embodiments, the first undepleted region 120 is on the order of 5 microns thick. Likewise, the second undepleted region 148 may also be on the order of 5 microns thick.

When a photon travels through silicon, the photon may be absorbed and transfer energy to a bound electron within the active depleted layer 108. This absorbed energy causes the electron to move from the valence band into the conduction band, creating an electron-hole pair. Silicon can absorb a wide range of wavelengths of light within a depth of a few tens of microns and so is well-suited as a photodetector material.

Applying a reverse bias to a photodiode sets up an electric field across the depletion region (e.g., the active volume) that will cause these charge carriers to the accelerated towards the anode (holes), or cathode (electrons). Therefore, an absorbed photon will result in a net flow of current in a reverse-biased photodiode.

When a sufficiently high electric field (>3×10^5 V/cm) is generated, a charge carrier will be accelerated to a point where it carries sufficient kinetic energy to create secondary charge pairs through a process called impact ionization. When the multiplication diverges, a single absorbed photon in the depletion region 108 can trigger an ionization cascade confined within the SPAD (e.g., the volume of silicon that is enclosed by the trenches 124, first undepleted region 120, and second undepleted region 148). The silicon will break down and become conductive, effectively amplifying the original electron-hole pair into a macroscopic current flow. The current flow created in the second undepleted region 148 will travel to the first type of metal contacts 140 for eventual flow through the device 100, 100'.

Although not visible in the cross-sectional view, a person of ordinary skill in the art will appreciate that the contacts 140 may be part of a larger metal grid that connects all of the different SPADs together in a circuit, which may also include the second type of metal contact 144. Specifically, the semiconductor device 100 may include a plurality of SPADs laid out in an array or grid-type pattern and a corresponding grid of metal lines or traces may be provided throughout the array.

With reference now to FIG. 2, additional details of the grid of metal lines or traces will be described. It should be appreciated that the view of FIG. 2 may correspond to a top view of the device depicted in FIGS. 1A and/or 1B. In this particular view, the device is seen from the top side rather than via a cross-sectional view. As will be discussed in further detail, the conductive trenches 124 form the grid that facilitates the current flow to a top side contact 228. Specifically, an array of APD or SPADs or SiPM 204 is shown from the front side to include a plurality of vertical trenches 208 and a plurality of horizontal trenches 212. It should be appreciated that either trenches 208 or trenches 212 may correspond to the trenches 124 depicted and described in connection with FIGS. 1A and 1B.

The trenches 208, 212 are connected with one another in a grid-type pattern such that individual and unique SPADs 216 reside between adjacent pairs of trenches 208 and adjacent pairs of trenches 212. Photon absorption within a particular SPAD 216 may result in a current that flows through the conductive trenches 220 and 208 and eventually reaches the shared contact pad 228. The current can find a parallel path also through the undepleted bottom region 120 but then it will re-emerge through the trenches to reach pad 228. In some embodiments, the shared contact 228 may correspond to the second type of metal contact 144.

According to some embodiments, the conductive trenches 208, 212 around each SPAD/APD 216 allow the creation a very low resistivity path of the undepleted layer 120 of each SPAD/APD to the front side without any additional structure inside the SPAD/APD itself. Indeed, the trenches 208, 212 provide both a vertical connection, from bottom to top of the semiconductor device 100, 100', and a grid-like horizontal connection to the external contact pad 228. In some embodiments, the external contact pad 228 may be provided as an interface between the SiPM 204 and a larger sensor system, sensor circuit, or the like.

With reference now to FIG. 3, additional details of a computational device 304 including a semiconductor device 100, 100' or a sensor having the same will be described in accordance with at least some embodiments of the present disclosure. The computational device 304 is shown to include a processor 308, computer memory 312, and a sensor 316 having the SPADs/APDs 320 as depicted and described herein. In some embodiments, the SPADs/APDs 320 may be provided as part of a SiPM 204 and the external contact pad 228 may be used to provide an output of the SPADs/APDs 320 to the sensor 316, which can be subsequently provided to the processor 308.

The processor 308 may correspond to any type of microprocessing device, micro-processor, CPU, ASIC, or other type of silicon device used to facilitate operation of the computational device 304. In some embodiments, the processor 308 may execute computer program instructions that are stored in memory 312 and, in some embodiments, those instructions may include time-of-flight calculation instructions that utilize, at least in part, light 104 measurements obtained at the sensor 316.

The memory 312 may include any type of known or yet to be developed computer memory device or collection of computer memory devices. In some embodiments, the memory 312 may be volatile or non-volatile in nature. For instance, the memory 312 may include one or more of RAM, ROM, EEPROM, flash memory, cache memory, buffer memory, or combinations thereof.

As can be appreciated, any of the semiconductor devices depicted and described herein may be implemented as on-chip solutions (e.g., as a single silicon wafer). In some embodiments, the silicon photomultiplier may be implemented in an Integrated Circuit (IC) chip having other circuit elements provided therein.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A photodetector, comprising:
 a plurality of single-photon avalanche diodes or avalanche photodiodes, at least one of the plurality of single-photon avalanche diodes or avalanche photodiodes comprising an un-depleted anode and cathode region which are separated by one or more conductive trenches that extend completely between the anode region and cathode region, wherein the one or more conductive trenches define an active volume of the at least one single-photon avalanche diode or avalanche photodiode and are configured to reflect light back into the active volume of the at least one single-photon avalanche diode or avalanche photodiode, wherein the one or more conductive trenches comprise:
 a polysilicon material;
 a conductive material deposited within a polysilicon material; and
 an outer trench doping that is positioned between the polysilicon material of the one or more conductive trenches and the active volume of the at least one single-photon avalanche diode or avalanche photodiode, and wherein the outer trench doping comprises a same type of doping as one of the anode region and the cathode region, wherein the one or more conductive trenches is in direct contact with the active volume of the at least one single-photon avalanche diode or avalanche photodiode.

2. The photodetector of claim 1, wherein the at least one single-photon avalanche diode or avalanche photodiode comprises a light-receiving surface and an opposing surface that at least partially reflects light received at the light-receiving surface back into the active volume of the at least one single-photon avalanche diode or avalanche photodiode.

3. The photodetector of claim 2, wherein the light-receiving surface comprises an anti-reflective material and wherein the opposing surface comprises a reflective material.

4. The photodetector of claim 3, wherein the opposing surface and the one or more conductive trenches completely enclose the active volume of the at least one single-photon avalanche diode on all sides except a side corresponding to the light-receiving surface.

5. The photodetector of claim 3, wherein the reflective material comprises metal.

6. The photodetector of claim 1, wherein a distance between the anode region and the cathode region is less than 20 microns and wherein the outer trench doping comprises a thickness on the order of one hundred nanometers.

7. The photodetector of claim 6, wherein the light comprises near-infrared light and wherein the thickness of the anode region and the cathode region is less than 5 microns.

8. The photodetector of claim 2, further comprising:
a conductive grid positioned in proximity with one of the anode region and cathode region.

9. The photodetector of claim 8, wherein the conductive grid is formed by the one or more conductive trenches.

10. The photodetector of claim 8, wherein the conductive grid is positioned on a light-receiving side of the active volume.

11. The photodetector of claim 8, wherein the conductive grid is positioned opposite a light-receiving side of the active volume.

12. The photodetector of claim 1, further comprising:
a dielectric layer positioned adjacent to at least one of the anode region and cathode region.

* * * * *